US009349995B2

(12) United States Patent
Chaudhari

(10) Patent No.: US 9,349,995 B2
(45) Date of Patent: May 24, 2016

(54) HYBRID ORGANIC/INORGANIC EUTECTIC SOLAR CELL

(71) Applicant: Ashok Chaudhari, Briarcliff Manor, NY (US)

(72) Inventor: Ashok Chaudhari, Briarcliff Manor, NY (US)

(73) Assignee: Solar-Tectic LLC, Briarcliff Manor, NY (US)

( * ) Notice: Subject to any disclaimer, the term of this patent is extended or adjusted under 35 U.S.C. 154(b) by 0 days.

(21) Appl. No.: 14/571,800

(22) Filed: Dec. 16, 2014

(65) Prior Publication Data

US 2015/0179985 A1  Jun. 25, 2015

Related U.S. Application Data

(60) Provisional application No. 61/919,985, filed on Dec. 23, 2013.

(51) Int. Cl.
| | |
|---|---|
| *H01L 51/52* | (2006.01) |
| *H01L 31/0392* | (2006.01) |
| *H01L 51/00* | (2006.01) |
| *H01L 51/42* | (2006.01) |

(52) U.S. Cl.
CPC ........ *H01L 51/5296* (2013.01); *H01L 31/0392* (2013.01); *H01L 51/0096* (2013.01); *H01L 51/4213* (2013.01); *Y02E 10/549* (2013.01)

(58) Field of Classification Search
None
See application file for complete search history.

(56) References Cited

U.S. PATENT DOCUMENTS 3,322,565 A  5/1967 Smith

| 6,236,061 | B1 * | 5/2001 | Walpita ............. H01L 23/49872 257/347 |
| 7,691,731 | B2 | 4/2010 | Bet et al. |
| 2009/0297774 | A1 | 12/2009 | Chaudhari |
| 2011/0033969 | A1 * | 2/2011 | Chaudhari ........ H01L 21/02422 438/73 |
| 2011/0146795 | A1 * | 6/2011 | Chang ................... C25D 11/12 136/260 |
| 2013/0206230 | A1 * | 8/2013 | Sridharan .............. H01L 23/10 136/259 |
| 2014/0352751 | A1 * | 12/2014 | Wu ..................... H01L 31/0725 136/244 |
| 2015/0114466 | A1 * | 4/2015 | Ahn ..................... H01L 31/0749 136/262 |

OTHER PUBLICATIONS

Pudasaini, P.R. et al. "High Efficiency Hybrid Silicon Nanopillar-Polymer Solar Cells", Dept. of Physics & Astronomy, and Dept. of Chemistry, University of Texas at San Antonio, Applied Materials & Interfaces, Jul. 1, 2013, pp. 9620-9627, ACS Publications, American Chemical Society, USA.
Call for Papers, Technical Program, Photovoltaic Specialists Conference, Jun. 14-19, 2015, pp. 1-33, 42nd., IEEE, New Orleans, US.
Babcock, L.E., and R.W. Christy, Electronbeam Deposited Thin Polymer Films: Electric Properties vs Bombarding Current, Journal of Applied Physics, 1972, 43, 1423, AIP Publishing, US.

* cited by examiner

*Primary Examiner* — William Coleman
*Assistant Examiner* — Kien Ly
(74) *Attorney, Agent, or Firm* — Keith D. Nowak; Carter Ledyard & Milburn LLP

(57) ABSTRACT

A method is disclosed for making a hybrid solar cell comprising organic and inorganic materials on an inexpensive substrate, such as glass. The materials are deposited on the substrate at low temperatures using eutectics and crystalline buffer layers such as MgO and Al2O3. Such a device can also be used for OLETs and OLEDs used in displays.

10 Claims, 1 Drawing Sheet

HYBRID ORGANIC/INORGANIC EUTECTIC SOLAR CELL

PRIORITY AND RELATED APPLICATIONS

This application claims priority to U.S. Provisional Patent Application Ser. No. 61/919,985 filed Dec. 23, 2013, entitled "Hybrid Organic/Inorganic Eutectic Solar Cell", which is hereby incorporated by reference in its entirety.

FIELD OF THE INVENTION

The present invention is related to photovoltaics, particularly to producing a hybrid solar cell from organic and inorganic material. It is also related to display technology, such as OLETs and OLEDs.

BACKGROUND OF THE INVENTION

Hybrid solar cells are designed to exploit the unique interfacial electronic properties at the organic-inorganic boundary. This class of devices is rooted in nanostructured TiO2 or ZnO integrated with conjugated polymers (P3HT), but is rapidly expanding to include many other organic and inorganic materials including single and polycrystalline silicon ($42^{nd}$ IEEE PV Specialists Conference 2015), for example silicon films on flexible polymer substrates or polymer buffered substrates.

A polymer is a large molecule, or macromolecule, composed of many repeated subunits. Because of their broad range of properties, both synthetic and natural polymers play an essential and ubiquitous role in everyday life. Polymers range from familiar synthetic plastics such as polystyrene to natural biopolymers such as DNA and proteins that are fundamental to biological structure and function. Polymers, both natural and synthetic, are created via polymerization of many small molecules, known as monomers. Their consequently large molecular mass relative to small molecule compounds produces unique physical properties, including toughness, viscoelasticity, and a tendency to form glasses and semicrystalline structures rather than crystals.

Hybrid photovoltaic devices have a potential for not only low-cost by roll-to-roll processing but also for scalable solar power conversion. Recently there has been a growing interest in hybrid solar cells. Hybrid solar cells need, however, increased efficiencies and stability over time before commercialization is feasible. In comparison to the 2.4% of the CdSe-PPV system, silicon photodevices have power conversion efficiencies greater than 20%. It is therefore desirable to leverage the unique electronic and optical properties and functionality afforded by organic and inorganic materials, and those which utilize quantum confined nanostructures to enhance charge transport and fine-tune the spectral sensitivity range ($42^{nd}$ IEEEPV Specialists Conference 2015).

Currently there are three types of hybrid solar cells: 1) polymer-nanoparticle composite, 2) carbon nanotubes, 3) dye-sensitized. Recent progress in materials science, however, now makes possible the production of a fourth, entirely new, hybrid solar cell which combines the benefits of a polymer with crystalline silicon and does so at a temperature that allows for material depositions on inexpensive substrates such as soda-lime glass.

U.S. Patent Application Publication 2009/0297774 (P. Chaudhari et al.) discloses a low temperature silicon deposition technique which allows for fabrication using organic materials as substrates.

U.S. Pat. No. 7,691,731 (Bet and Kar) discloses a low temperature silicon deposition technique on soft polymer substrates for a hybrid organic/inorganic solar cell. The process involves providing an aqueous solution medium including a plurality of semiconductor nanoparticles dispersed therein having a median size less than 10 nm, and applying the solution medium to at least one region of a substrate to be coated. The substrate has a melting or softening point of <200° C. The solution medium is evaporated and the region is laser irradiated for fusing the nanoparticles followed by annealing to obtain a continuous film having a recrystallized microstructure.

According to Bet and Kar, recent advances in physical vapor deposition (PVD) chemical vapor deposition (CVD) techniques and the use of excimer laser annealing (ELA) and solid phase annealing (SPA) have reduced the processing temperatures in thin film microelectronics considerably, thus promoting the use of inexpensive lightweight polymer substrates. However, existing silicon film preparation methods produce amorphous, or randomly aligned microcrystalline or polycrystalline Si films containing high densities of intrinsic microstructural defects which limit the utility of such films for high quality microelectronic applications. Deposition of near-single crystal or single crystal Si films on polymer substrates is a step toward achieving high quality flexible microelectronics. However, the non-crystalline nature of polymer makes it very difficult to employ a number of existing vapor-liquid and solid phase epitaxial growth processes because such processes rely on the crystalline character of the substrates. Secondly, the low melting or softening temperature of polymers makes it impractical to utilize the steady-state directional solidification processes, such as Zone melting recrystallization of Si films on SiO2 using a CW laser, a focused lamp, an electron beam or a graphite strip heater, previously developed for producing single crystal Si films. Usually the thin films formed on amorphous substrates are amorphous or are randomly polycrystalline in the sub-micrometer scale. Therefore, a low temperature process for forming highly crystalline or single crystal layers on temperature sensitive polymeric substrates is needed.

Recently there has also been research to make OLEDs (organic light emitting diodes) and OLETs (organic light emitting transistors) from hybrid organic/inorganic materials. However, the research as far as is known to the applicants of this invention, has not made use of eutectics and buffered, textured, substrates for deposition of the inorganic semiconductor material onto the organic polymer layer.

The above-cited references are incorporated by reference as if set forth fully herein.

OBJECT OF THE INVENTION

It is an object of the present invention to provide a method of producing a hybrid solar cell.

It is yet another object of this invention to provide a method of producing a hybrid solar cell combining a polymer and inorganic material such as, but not limited to, silicon.

It is yet another object of this invention to provide a method of producing a hybrid polymer/inorganic solar cell at low temperature.

It is yet another object of this invention to provide a method of forming crystalline polymer layers on an inexpensive substrate, on which inorganic semiconductor films can then be deposited.

It is yet another object of this invention to provide a method of producing a hybrid solar cell on an inexpensive substrate such as soda-lime glass or metal tape.

It is yet another object of this invention to provide a method of producing a hybrid solar cell from cadmium selenide (CdSe).

SUMMARY OF INVENTION

The foregoing and other objects can be achieved by depositing inorganic semiconductor films such as silicon from a eutectic alloy melt on an inexpensive substrate such as glass on which a polymer film has been deposited on a textured buffer layer such as MgO or Al2O3, and all at a temperature below the softening point of glass.

DETAILED DESCRIPTION OF THE INVENTION

Figure 1:
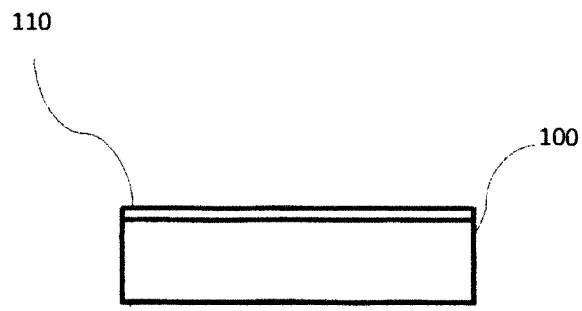
FIG. 1 shows a glass substrate [100] with a textured buffer layer [110].
Figure 2:
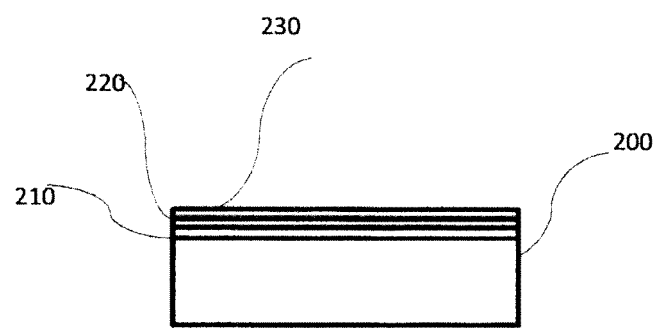
FIG. 2 shows a glass substrate [200] with a textured buffer layer [210] with a polymer film on top [220] on which a metal thin-film has been deposited [230].
Figure 3:
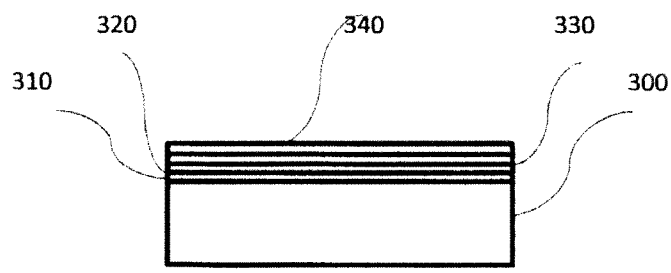
FIG. 3 shows a glass substrate [300] with a textured buffer layer [310] with a polymer film on top [320] on which a metal thin-film has been deposited [330] and finally a eutectic alloy thin film [340] at the very top.

A good high vacuum system with two electron beam guns is used to deposit a metal such as gold and a semiconductor such as silicon, independently. A glass substrate 100 coated with a polymer film, preferably textured 210, is held at temperatures between 575 and 600 C. These are nominal temperatures. It is understood to one skilled in the art that lower or higher temperatures can also be used depending on the softening temperature of the glass substrate or the reaction kinetics of either gold or silicon with polymer layer. A thin gold film of approximately 10 nm thickness is deposited on the polymer film 230. This is followed by a silicon film deposited at a rate of 2 nm per minute on top of the gold film on polymer 340. The silicon film nucleates heterogeneously or homogenously onto the polymer surface to form the desired film.

The film can now be cooled to room temperature, where the film now comprises two phases: gold and a relatively large grained and textured film of silicon/polymer for an inorganic/organic hybrid semiconductor device.

Since a textured polymer buffer layer is desirable, the polymer film can be deposited onto MgO or Al2O3 which has in turn been deposited with texture on the glass. The MgO or Al2O3 layer serves to align the polymer film such that it is textured.

We have used gold as an example of a metal used in the alloy. However, it is understood that many other metals could be used, for example, Al or Ag or Sn. The same applies to the semiconductor material. For example, instead of silicon one could use germanium of gallium arsenide class of materials. Furthermore, in our example, two electron beam guns serve as an illustrative example. It is understood to one skilled in the art that other methods such as a single gun with multiple hearths, chemical vapor deposition, thermal heating, or sputtering can be used.

The non-crystalline nature of a polymer makes it very difficult to employ a number of existing vapor-liquid and solid phase epitaxial growth processes because such processes rely on the crystalline character of the substrates. The present invention solves this problem because the polymer film is deposited on a textured substrate, such as MgO or Al2O3, on glass, thereby replicating the texture of the MgO or Al2O3 layers 220. Deposition of the silicon (or other semiconductor material such as germanium) can be performed by methods such as those mentioned above and the polymer will obtain a crystalline, textured, structure. Moreover, the use of a metal such as Au or Al lowers the temperature at which the semiconductor film is deposited onto the polymer coated substrate, thereby further reducing the deposition temperature to as low as 30 degrees Celsius (in the case of the metal gallium and it's eutectic with Si).

Polymers are of two types: natural and synthetic. Natural polymeric materials such as shellac, amber, wool, silk and natural rubber. A variety of other natural polymers exist, such as cellulose, which is the main constituent of wood and paper.

The list of synthetic polymers includes synthetic rubber, phenol formaldehyde resin (or Bakelite), neoprene, nylon, polyvinyl chloride (PVC or vinyl), polystyrene, polyethylene, polypropylene, polyacrylonitrile, PVB, silicone, and many more.

Any of the above mentioned polymers can be applied in this invention.

Deposition of the polymer layer on the textured substrate can take place using a number of the known processes in the art, such as: thermal spray, spin-coating, vapor deposition, CVD, sputter deposition, e-beam evaporation, etc. The deposition technique is adapted to the polymer being deposited. Here we provide one example of a patent illustrating one particular process which enables the deposition of a polymer film on a substrate, and one example of a publication illustrating the same. In both examples the process used is the common e-beam evaporation technique, also used today in the deposition of inorganic semiconductor films such as silicon. And in both examples glass was used as a substrate. A common deposition technique, in this case e-beam, greatly facilitates and simplifies the overall two-material deposition of organic and inorganic films. The examples are: U.S. Pat. No. 3,322,565 A "Polymer Coatings Through Electron Beam Evaporation" by H. Smith, Jr., and publication "Electron-Beam Deposited Thin Polymer Films: Electrical Properties vs Bombarding Current" by Babcock and Christy.

The invention claimed is:

1. A method of growing semiconductor films comprising the steps of:
providing a substantially non-crystalline substrate having a predetermined softening point;
depositing a textured buffer layer on said substrate;
depositing a polymer film on said buffer layer; and
depositing on said polymer film a silicon inorganic film,
wherein the buffer layer, polymer film, and silicon inorganic film are each deposited at a respective deposition temperature that is below the softening point of the substrate.

2. The method of claim 1, where said substantially non-crystalline substrate is glass or plastic.

3. The method of claim 1, where the buffer layer is magnesium oxide (MgO) or aluminum oxide ($Al_2O_3$).

4. The method of claim 1, where said silicon inorganic film is a semiconductor comprising Cadmium Selenide (CdSe).

5. The method of claim 1, where said silicon inorganic film is single crystalline, highly textured, and/or large grained.

6. A method of growing semiconductor films comprising the steps of:
providing a substantially non-crystalline substrate having a predetermined softening point;
depositing a textured buffer layer on said substrate;
depositing a polymer film on said buffer layer; and depositing on said polymer film an inorganic semiconductor film, wherein the buffer layer, polymer film, and inorganic semiconductor film are each deposited at a respective deposition temperature that is below the softening point of the substrate.

7. The method of claim 6, where said substantially non-crystalline substrate is glass or plastic.

8. The method of claim 6, where the buffer layer is magnesium oxide (MgO) or aluminum oxide ($Al_2O_3$).

9. The method of claim 6, where said inorganic semiconductor film is a semiconductor comprising Cadmium Selenide (CdSe).

10. The method of claim 6, where said silicon inorganic film is single crystalline, highly textured, and/or large grained.

* * * * *